United States Patent
Gao (10) Patent No.: US 9,268,446 B2
(45) Date of Patent: Feb. 23, 2016

(54) MONITOR, TOUCHSCREEN SENSING MODULE THEREOF, AND METHOD FOR MANUFACTURING THE TOUCHSCREEN SENSING MODULE

(71) Applicant: NANCHANG O-FILM TECH. CO., LTD., Nanchang (CN)

(72) Inventor: Yulong Gao, Nanchang (CN)

(73) Assignee: Nanchang O-Film Tech. Co., Ltd., Nanchang, Jiangxi (CN)

( * ) Notice: Subject to any disclaimer, the term of this patent is extended or adjusted under 35 U.S.C. 154(b) by 213 days.

(21) Appl. No.: 14/000,059

(22) PCT Filed: Jul. 6, 2013

(86) PCT No.: PCT/CN2013/078947
§ 371 (c)(1),
(2) Date: Aug. 16, 2013

(87) PCT Pub. No.: WO2014/121585
PCT Pub. Date: Aug. 14, 2014

(65) Prior Publication Data
US 2014/0218636 A1 Aug. 7, 2014

(30) Foreign Application Priority Data

Feb. 6, 2013 (CN) .......................... 2013 1 0048426

(51) Int. Cl.
*G06F 3/045* (2006.01)
*G06F 3/044* (2006.01)
(Continued)

(52) U.S. Cl.
CPC ............... *G06F 3/044* (2013.01); *H05K 3/107* (2013.01); *H05K 3/1258* (2013.01); *H05K 3/4611* (2013.01); *H05K 2201/09681* (2013.01); *H05K 2201/10128* (2013.01); *Y10T 29/49105* (2015.01)

(58) Field of Classification Search
CPC ..................... G06F 3/044; H05K 2201/09681; H05K 2201/10128; H05K 3/107; H05K 3/1258; H05K 3/4611; Y10T 29/49105

USPC .................... 345/156–184; 178/18.01–20.04; 174/250, 260–262
See application file for complete search history.

(56) References Cited

U.S. PATENT DOCUMENTS

2008/0252614 A1* 10/2008 Tatehata et al. ............... 345/174
2012/0212432 A1   8/2012 Murata et al.
(Continued)

FOREIGN PATENT DOCUMENTS

CN       102645996 A     8/2012
CN       102722279 A    10/2012
(Continued)

OTHER PUBLICATIONS

KR20120121573A, English Translation, Nov. 2012.*
(Continued)

*Primary Examiner* — Kent Chang
*Assistant Examiner* — Nelson Rosario
(74) *Attorney, Agent, or Firm* — Coats & Bennett, P.L.L.C.

(57) ABSTRACT

A touchscreen sensing module includes a first baseplate, a first conductive layer, a second baseplate, a second conductive layer, and a supporting substrate. A first groove in a predetermined shape is defined on a side of the first baseplate. The first conductive layer matches with the first groove in shape, and the first conductive layer is received in the first groove. A second groove in a predetermined shape is defined on a side of the second baseplate. The second conductive layer matches with the second groove in shape, and the second conductive layer is received in the second groove. The first conductive layer and the second conductive layer respectively match with the first groove and the second groove in shape, no etching is needed to obtain electrodes when forming the conductive layers, which avoids material waste and reduces costs In addition, a monitor is also provided by the present invention.

15 Claims, 6 Drawing Sheets

(51) Int. Cl.
*H05K 3/10* (2006.01)
*H05K 3/12* (2006.01)
*H05K 3/46* (2006.01)

(56) References Cited

U.S. PATENT DOCUMENTS

| | | | |
|---|---|---|---|
| 2012/0212449 A1* | 8/2012 | Kuriki | 345/174 |
| 2012/0227259 A1 | 9/2012 | Badaye et al. | |
| 2012/0293430 A1 | 11/2012 | Kitada | |
| 2013/0120846 A1* | 5/2013 | Dai et al. | 359/601 |
| 2014/0116754 A1 | 5/2014 | Gao et al. | |
| 2014/0191771 A1 | 7/2014 | Nam et al. | |
| 2014/0299361 A1* | 10/2014 | Nakamura et al. | 174/253 |
| 2015/0084907 A1* | 3/2015 | Burberry et al. | 345/174 |

FOREIGN PATENT DOCUMENTS

| | | |
|---|---|---|
| CN | 202632259 U | 12/2012 |
| CN | 102903423 A | 1/2013 |
| CN | 103105970 A | 5/2013 |
| CN | 203224850 U | 10/2013 |
| JP | 2012094115 A | 5/2012 |
| JP | 2012519329 A | 8/2012 |
| JP | 2012243058 A | 12/2012 |
| JP | 2013020530 A | 1/2013 |
| KR | 20120018059 A | 2/2012 |
| KR | 20120072187 A | 7/2012 |
| KR | 20120121573 A | 11/2012 |
| KR | 20120121573 A * | 11/2012 |
| TW | 201224903 A | 6/2012 |
| WO | 2010099132 A2 | 9/2010 |
| WO | 2011159107 A2 | 12/2011 |
| WO | 2012169848 A2 | 12/2012 |

OTHER PUBLICATIONS

International search report, International application No. PCT/CN2013/078947. Date of mailing: Nov. 14, 2013. SIPO: Beijing, China.

* cited by examiner

MONITOR, TOUCHSCREEN SENSING MODULE THEREOF, AND METHOD FOR MANUFACTURING THE TOUCHSCREEN SENSING MODULE

FIELD OF THE INVENTION

The present disclosure relates to electronic technology, and more particularly relates to a monitor, a touchscreen sensing module, and a method for manufacturing the touchscreen sensing module.

BACKGROUND OF THE INVENTION

Touchscreen is a sensing device capable of receiving touch input signals. The touchscreen brings a new appearance for information exchange and is a new attractive information interactive device. For conventional touchscreens, ITO (Indium Tin Oxide) conductive layer is still a much important part.

When manufacturing ITO conductive layer, an ITO film is coated on an entire surface of a substrate, ITO patterning is then carried out to obtain electrodes, and transparent electrode silver leads are finally made. In ITO patterning, the formed ITO film is etched by etching process. ITO is a kind of expensive material, and patterning results in a large amount of waste of ITO, thereby increasing the cost. Besides, corrosive chemical materials are used in etching process, which causes environmental pollution.

SUMMARY OF THE INVENTION

The present disclosure is directed to provide a monitor which effectively reduces costs, a touchscreen sensing module thereof, and a method for manufacturing the touchscreen sensing module.

According to an aspect of the present disclosure, a touchscreen sensing module is provided. The touchscreen sensing module includes:

a first baseplate defining a first groove in a predetermined shape on a side thereof;

a first conductive layer matching with the first groove in shape, the first conductive layer being received in the first groove;

a second baseplate attached to a side of the first baseplate defining the first groove, a second groove in a predetermined shape being defined on a side away from the first baseplate;

a second conductive layer matching with the second groove in shape, the second conductive layer being received in the second groove; and a supporting substrate attached to a side of the second baseplate defining the second groove, the first conductive layer and the second conductive layer being clamped between the supporting substrate and the first baseplate.

In a preferred embodiment, the first baseplate comprises a first substrate and a first matrix layer attached to the first substrate, the first groove is defined on the first matrix layer, the second baseplate comprises a second substrate and a second matrix layer attached to the second substrate, the second groove is defined on the second matrix layer.

In a preferred embodiment, a thickness of the first conductive layer is not greater than a depth of the first groove, and a thickness of the second conductive layer is not greater than a depth of the second groove.

In a preferred embodiment, the first conductive layer and the second conductive layer are both conductive grids constructed by intercrossed conductive wires, the conductive grids comprise a plurality of grid units, the conductive wires of the first conductive layer are received in the first groove, the conductive wires of the second conductive layer are received in the second groove, and a width of the conductive wires ranges from 500 nm to 5 μm.

In a preferred embodiment, material of the conductive wires is metal, or conductive polymer, or grapheme, or carbon nano-tube, or ITO.

In a preferred embodiment, the metal includes one of Au, Ag, Cu, Al, Ni and Zn, or alloy of at least two of them.

In a preferred embodiment, the grid units are rhomboid, or rectangle, or parallelogram, or curved quadrilateral, and a projection of the center of a grid unit of the second conductive layer on the first conductive layer is spaced a predetermined distance from the center of a grid unit of the first conductive layer.

In a preferred embodiment, the projection of the center of the grid unit of the second conductive layer on the first conductive layer is spaced a distance between 1/3a and $\sqrt{2}a/2$ from the center of the grid unit of the first conductive layer, where "a" is the side length of the grid unit.

In a preferred embodiment, projections on the first conductive layer of connecting lines of centers of the grid units in the same arrangement direction on the second conductive layer are misaligned with connecting lines of centers of the grid units in the same arrangement direction on the first conductive layer.

In a preferred embodiment, the touchscreen sensing module further comprises first electrode leads and second electrode leads, the first electrode leads are embedded in the first baseplate and electrically connected to the first conductive layer, and the second electrode leads are embedded in the second baseplate and electrically connected to the second conductive layer.

In a preferred embodiment, the first conductive layer is divided into a plurality of mutually-insulated first gird strips, the second conductive layer is divided into a plurality of mutually-insulated second gird strips, the first electrode leads comprise a plurality of leads electrically connected to the first grid strips respectively, and the second electrode leads comprise a plurality of leads electrically connected to the second grid strips respectively.

In a preferred embodiment, the first electrode leads and the second electrode leads are both single solid lines.

In a preferred embodiment, a first connecting portion in a strip shape is provided on the end of a first electrode lead near to the first conductive layer, the first connecting portion has a greater width than other portion of the first electrode lead, a second connecting portion in a strip shape is provided on the end of a second electrode lead near to the second conductive layer, and the second connecting portion has a greater width than other portion of the second electrode lead.

In a preferred embodiment, the first electrode leads and the second electrode leads are constructed by mesh-intersecting conductive wires, and a grid cycle of the first electrode leads and the second electrode leads is less than a grid cycle of the first conductive layer and the second conductive layer.

In a preferred embodiment, a first electrode switching line is provided between a first electrode lead and the first conductive layer, a second electrode switching line is provided between a second electrode lead and the second conductive layer, the first switching line and the second switching line are consecutive conductive wires, the first switching line is connected to the first conductive layer and ends of at least two conductive wires of the first electrode lead, and the second switching line is connected to the second conductive layer and ends of at least two conductive wires of the second electrode lead.

According to another aspect of the present disclosure, a monitor is provided. The monitor includes:
 a display; and
 a touchscreen sensing module of any of the above-mentioned preferred embodiments, a side of the first baseplate away from the first conductive layer being adhered to the display to make the touchscreen sensing module be attached to the display.

According to another aspect of the present disclosure, a method for manufacturing a touchscreen sensing module is provided. The method for manufacturing the touchscreen sensing module, includes steps of:
 providing a first substrate, a second substrate, and a supporting substrate are provided, and coating gel on a surface of the first substrate to form a first matrix layer;
 forming a patterned first groove on a side of the first matrix layer facing away from the first substrate by imprinting, and filling conductive material into the first groove to form a first conductive layer;
 attaching the second substrate to the first matrix layer, and coating gel on a side of the second substrate facing way from the first matrix layer to form a second matrix layer;
 forming a patterned second groove by imprinting on a side of the second matrix layer facing away from the second substrate, and filling conductive material into the second groove to form a second conductive layer; and
 attaching the supporting substrate to a side of the second matrix layer facing away from the second substrate.

In a preferred embodiment, first electrode leads connecting to the first conductive layer are formed when filling conductive material into the first groove to form the first conductive layer, and second electrode leads connecting to the second conductive layer are formed when filling conductive material into the second groove to form the second conductive layer.

Comparing to the conventional touchscreen sensing module, the touchscreen sensing module has at least the following advantages.

Firstly, the first conductive layer and the second conductive layer of the touchscreen sensing module are respectively received in the first groove and the second groove, and the first conductive layer and the second conductive layer respectively match with the first groove and the second groove in shape. Therefore, no etching process is needed to obtain electrodes when forming conductive layers, which avoids from wasting of material and reduces costs.

Secondly, because no etching process is needed during manufacturing the touchscreen sensing module. Therefore, it avoids from using of chemical substances, and thereby avoids environmental pollution.

DETAILED DESCRIPTION OF THE EMBODIMENTS

The disclosure is described more fully hereinafter with reference to the accompanying drawings, in which preferred embodiments of the invention are shown. The disclosure may, however, be embodied in many different forms and should not be construed as limited to the embodiments set forth herein. Rather, these embodiments are provided so that this disclosure will be thorough and complete.

It should be noted that, when an element is described as "fixed to" another element, it means the element can be fixed to another element directly or with a middle element. When an element is described as "connected to" another element, it means the element can be connected to another element directly or with a middle element.

Unless defined elsewhere, all the technology and science terms used herein should be with the same meaning as understood by those skilled in the art. All the terms used herein are just for the purpose of describing detailed embodiments, but not limited to the scope of the disclosure. All the "and/or" used herein comprises one listed item, or any combination of more related listed items.

Figure 1:
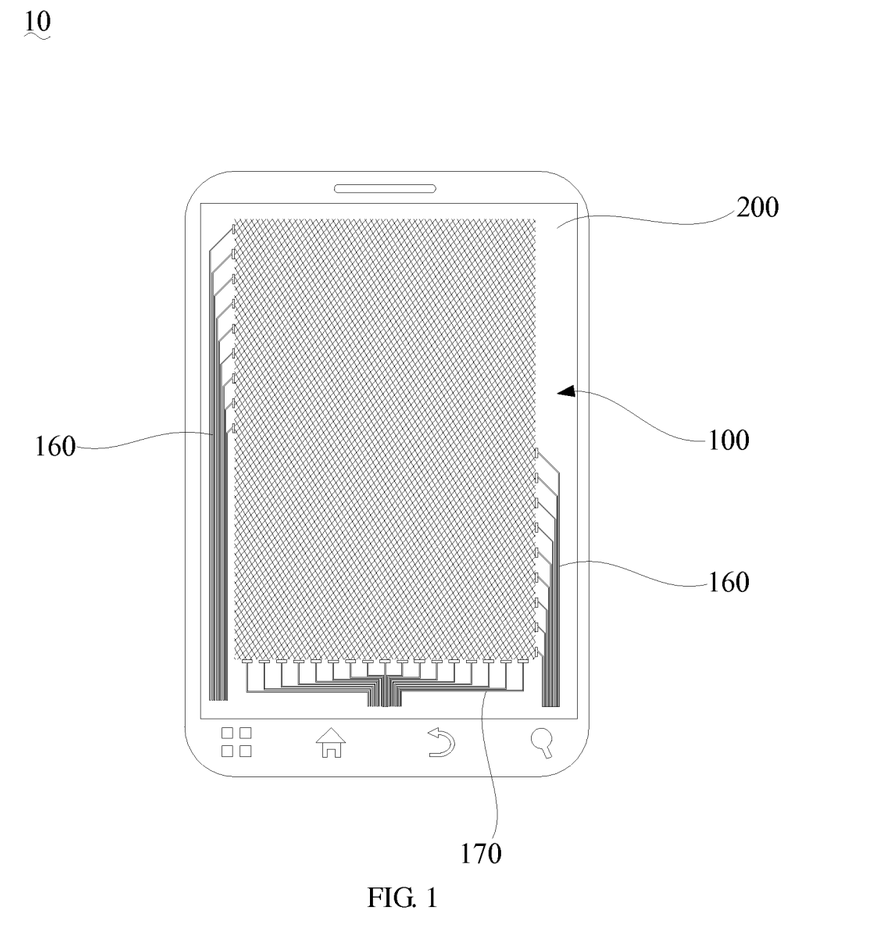
FIG. 1 is a schematic view of an embodiment of a monitor according to the present disclosure.
Figure 2:
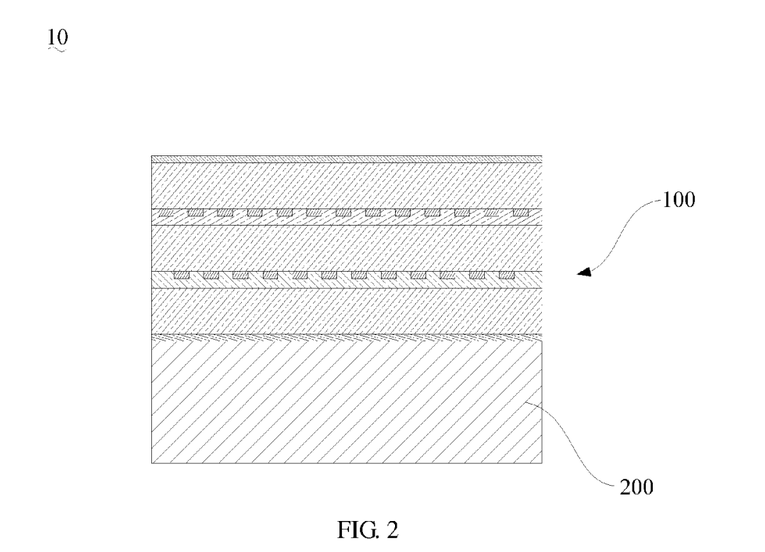
FIG. 2 is a schematic view of layer structure of the monitor in FIG. 1.

Referring to FIG. 1 and FIG. 2, a monitor 10 according to an embodiment of the disclosure comprises a monitor sensing module touchscreen sensing module 100 and a display 200. The monitor sensing module 100 is attached to the display 200.

Figure 3:
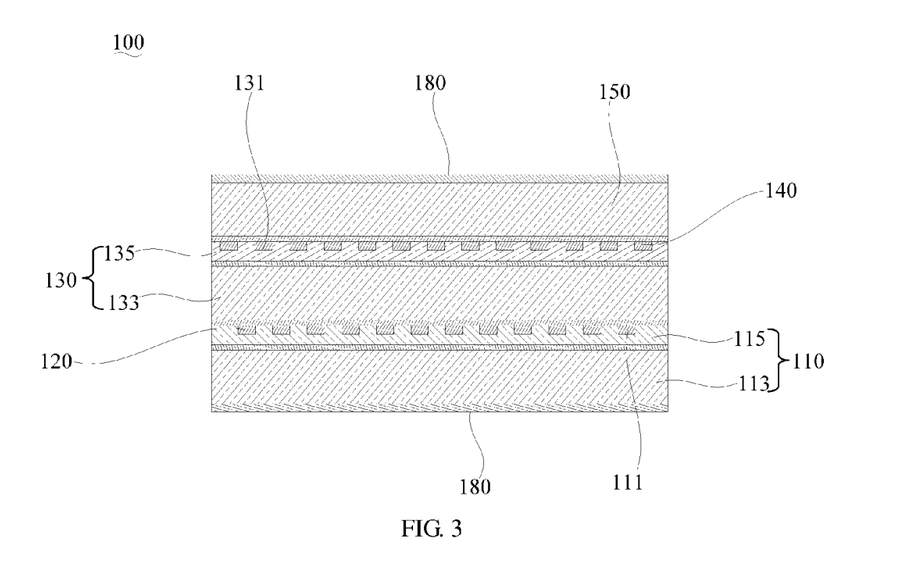
FIG. 3 is a schematic view of a touchscreen sensing module of the monitor in FIG. 1.

Also referring to FIG. 3, the touchscreen sensing module 100 comprises a first baseplate 110, a first conductive layer 120, a second baseplate 130, a second conductive layer 140, a supporting substrate 150, first electrode leads 160, and second electrode leads 170.

The first baseplate 110 defines a first groove 111 in a predetermined shape on a side thereof. In the present embodiment, the first baseplate 110 includes a first substrate 113 and a first matrix layer 115 attached to the first substrate 113. The first matrix layer 115 can be formed by coating gel on the first substrate 113 and solidifying the gel. The first groove 111 is defined on the first matrix layer 115. In alternative embodiments, the first baseplate 110 may only include the first substrate 113 and the first groove 111 is defined on the first substrate 113.

The first substrate 113 is a film of insulating material of polyethylene terephthalate (PET). In other embodiments, the first substrate 113 may be a film of other materials, such as polybutylene terephthalate (PBT), polymethylmethacrylate (PMMA), polycarbonate (PC), glass etc. When the touchscreen sensing module 100 is applied for a touchscreen device, the material for the first substrate 113 is optimal to be transparent insulating material. In addition, the first groove 111 can be formed on the first matrix layer 115 by imprinting. The first groove 111 can be imprinted into a predetermined shape, according to demand for shape of electrode.

The first matrix layer 115 is attached to the first substrate 113. The first matrix layer 115 is formed by coating the gel on the first substrate 113. A thickness of the first matrix layer 115 is less than that of the first substrate 113. The first matrix layer 115 is made of transparent insulating material, which is different from the material of the first substrate 113. In the present embodiment, the gel for forming the first matrix layer 115 is solvent-free UV-curing acrylic resin. In other embodiments, the gel for forming the first matrix layer 115 can be other light-curing adhesive, heat-curing adhesive, and self-curing adhesive. Herein, the light-curing adhesive can be a mixture of prepolymer, monomer, photoinitiator, and additive, in molar ration of 30~50%, 40~60%, 1~6%, and 0.2~1%. Herein, the prepolymer is at least one of epoxy acrylate, polyurethane acrylate, polyether acrylates, polyester acrylate, and acrylic resin; the monomer is at least one of monofunctional (IBOA, IBOMA, HEMA, etc.), bifunctional (TPGDA, HDDA, DEGDA, NPGDA, etc.), trifunctional, and multifunctional (TMPTA, PETA, etc.); the photoinitiator is benzophenone, desoxybenzoin etc. Furthermore, additive in molar ration of 0.2~1% can be added into the mixture. The additive may be hydroquinone, p-methoxyphenol, benzoquinone, or 2,6-di-tert-butyl-cresol etc.

Figure 6:
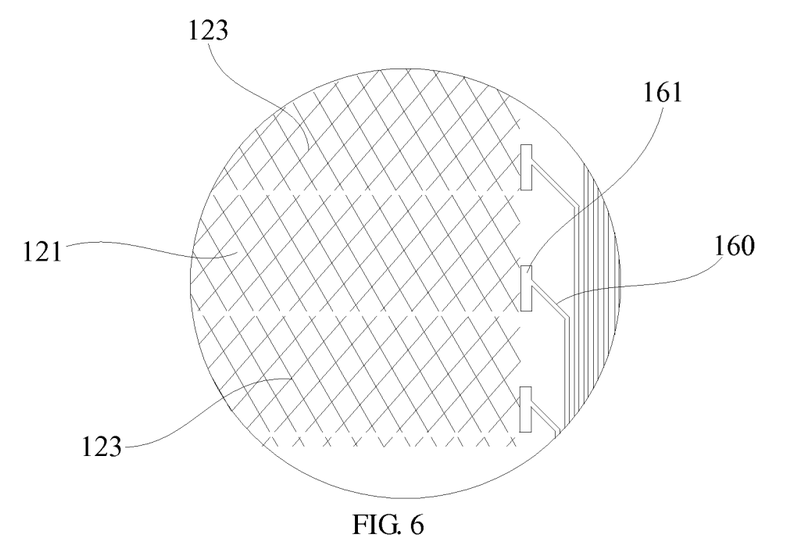
FIG. 6 is a partially-enlarged schematic view of a first conductive layer of the touchscreen sensing module in FIG. 3.

Also referring to FIG. 6, the first conductive layer 120 and the first groove 111 match with each other in shape, and the first conductive layer 120 is received in the first groove 111. The first groove 111 can be in a predetermined shape, accordingly the first conductive layer 120 is in a predetermined shape without etching. A thickness of the first conductive layer 120 is less than a depth of the first groove 111. The first baseplate 110 protects the first conductive layer 120 from being damaged in subsequent processes. In the present invention, a side of the first base plate 110 away from the first conductive layer 120 is attached to the display 200, to bond the touchscreen sending module 100 to the display 200. In other embodiments, the thickness of the first conductive layer 120 can be equal to the depth of the first groove 111.

In the present embodiment, the first conductive layer 120 is a conductive grid constructed by inter-crossed metal wires. The conductive grid has a plurality of grid units. A width of the conductive wires ranges from 500 nm to 5 μm. Herein, the grid units of the first conductive layer 120 are first conductive grid units 121. Specifically, nano silver ink is filled in the first groove 111 by scrapping technology, and is then sintered in the condition of 150° C. to make elemental silver of the nano silver ink be sintered into conductive wires. Herein, solid content of the silver ink is 35%, and the solvent is volatilized during sintering. Since the first groove 111 can be imprinted into the predetermined shape of required electrode, no further forming is needed after forming the conductive grid, which saves material and improves efficiency.

The second baseplate 130 is attached to a side of the first baseplate 110 defining the first groove 111. The second baseplate 130 defines a second groove 131 in a predetermined shape on a side away from the first baseplate 110. In the present embodiment, the second baseplate 130 includes a second substrate 133 and a second matrix layer 135 attached to the second substrate 133. Herein, the second matrix layer 135 can be formed by coating gel on the second substrate 133 and then solidifying the gel. The second groove 131 is defined on the second matrix layer 135. In other embodiments, the second baseplate 130 can only include the second substrate 133 and the second groove 131 is defined on the second substrate 133. Moreover, the second groove 131 can be imprinted into a predetermined shape, according to demand for shape of electrode.

The shape and material of the second substrate 133 is the same as those of the first substrate 113, and the shape and construction of the second matrix layer 135 is the same as those of the first matrix layer 115.

Figure 7:
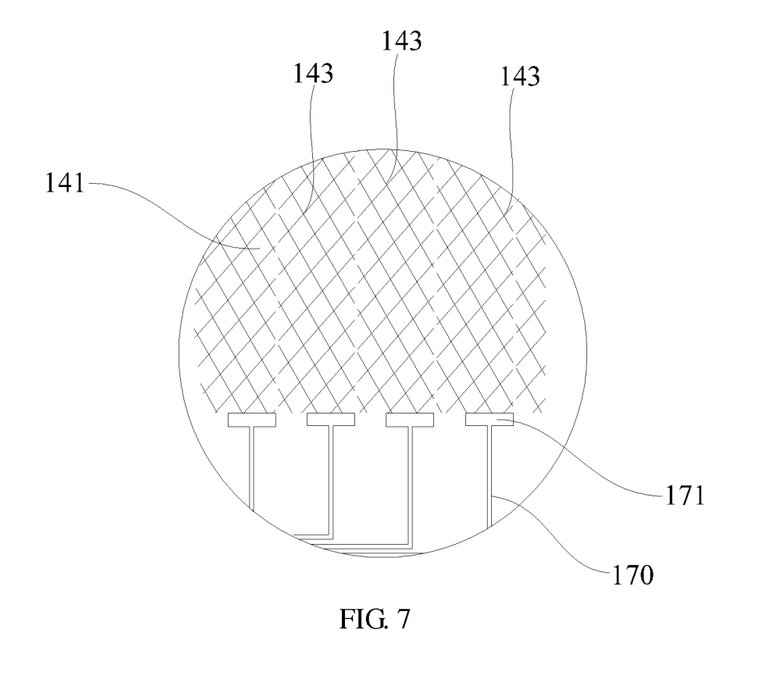
FIG. 7 is a partially-enlarged schematic view of a second conductive layer of the touchscreen sensing module in FIG. 3.

Also referring to FIG. 7, the second conductive layer 140 and the second groove 131 match with each other in shape and the second conductive layer 140 is received in the second groove 131. The second groove 131 can be in a predetermined shape, accordingly the second conductive layer 140 is in a predetermined shape without etching. In addition, a thickness of the second conductive layer 140 is less than a depth of the second groove 131. The second baseplate 130 protects the second conductive layer 140 from being damaged in subsequent processes. In the present invention, the second conductive layer 140 is a conductive grid constructed by inter-crossed metal wires. The conductive grid has a plurality of grid units. A width of the conductive wires ranges from 500 nm to 5 μm. Herein, the grid units of the second conductive layer 140 are second conductive grid units 141. Specifically, nano silver ink is filled in the second groove 131 by scrapping technology, and is then sintered in the condition of 150° C. to make elemental silver of the nano silver ink be sintered into conductive wires. Herein, solid content of the silver ink is 35%, and the solvent is volatilized during sintering. Since the second groove 131 can be imprinted into the predetermined shape of required electrode, no further forming is needed after forming the conductive grid, which saves material and improves efficiency. In other embodiments, the thickness of the second conductive layer 140 may be equal to the depth of the second groove 131.

In addition, material for manufacturing the first conductive layer 120 and the second conductive layer 140 in the present embodiment is one of Au, Ag, Cu, Ni, Al, and Zn, or alloy of at least two of them. It can be understood that, the material for manufacturing the first conductive layer 120 and the second conductive layer 140 is conductive material to implement corresponding function, such as carbon nano-tube, grapheme, conductive polymer etc.

Figure 4:
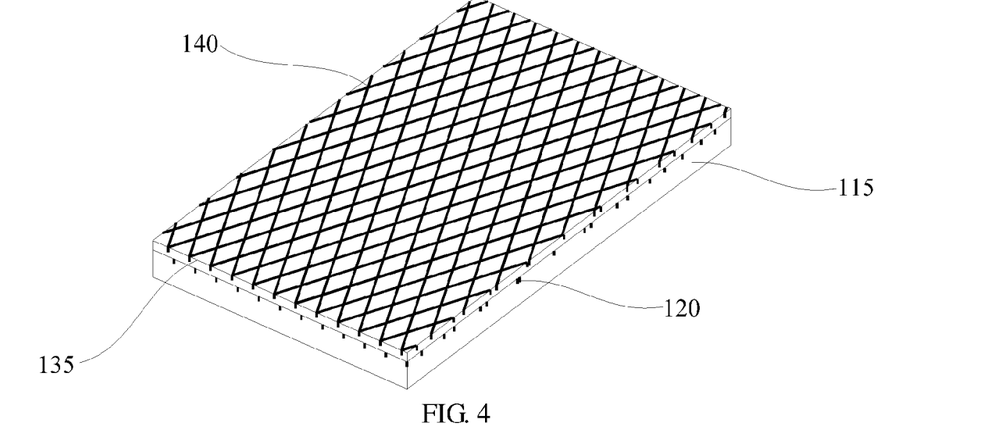
FIG. 4 is a schematic view of the touchscreen sensing module in FIG. 3.
Figure 5:
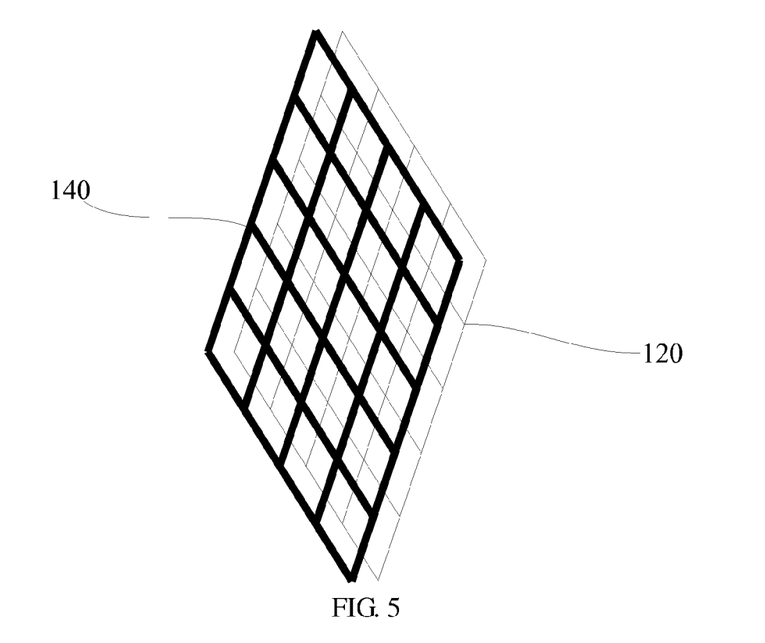
FIG. 5 is a schematic view of the touchscreen sensing module in FIG. 3, viewed from another angle.

Also referring to FIG. 4 and FIG. 5, in the present embodiment, the grid units are rhombic. The centers of the grid units of the second conductive layer 140 are projected on the first conductive layer 120, with the projections spaced a predetermined distance from the centers of the grid units of the first conductive layer 120. Specifically in the present embodiment, the predetermined distance ranges from 1/3a to $\sqrt{2}a/2$, wherein "a" is the side length of a grid unit. Therefore, the conductive wires constructing the first conductive layer 120 and the second conductive layer 140 are deviated from each other for a certain distance, to avoid serious Moire phenomenon in display 200. In other embodiments, the grid may also be rectangle, or parallelogram, or curved quadrilateral with four curved sides, two opposite sides of which are in the same shape and with the same curve trend.

Furthermore, connecting lines of the centers of the second grid units 141 in the same arrangement direction of the second conductive layer 140 are projected on the second baseplate 130, with the projections misaligned with connecting lines of centers of the first grid units 121 in the same arrangement direction of the first conductive layer 120. Moire phenomenon is thus further reduced.

The supporting substrate 150 is attached to a side of the second baseplate 130 defining the second groove 131. The first conductive layer 120 and the second conductive layer 140 are clamped between the supporting substrate 150 and the first baseplate 110. The supporting substrate 150 can be rigid or flexible. When the touchscreen sensing module 100 is adopted to manufacture the display 10, the supporting substrate 150 is easy for full lamination and improves quality of product. In addition, material of the supporting substrate 150 is the same as the material of the first substrate 113 and the second substrate 133.

The first electrode leads 160 are embedded in the first baseplate 110 and electrically connected to the first conductive layer 120. When the touchscreen sensing module 100 is used to manufacture a touchscreen of an electronic device, the first electrode leads 160 are used to electrically connect the first conductive layer 120 and a controller of the electronic device, thus enabling the controller to sense operation on the touchscreen. In the present embodiment, the first electrode leads 160 are single solid lines. Grooves for receiving the first electrode leads 160 are defined in the first baseplate 110. The first electrode leads 160 are received in the grooves. Furthermore, a first connecting portion 161 is formed on each of the first electrode lead 160. The first connecting portions 161 are located on ends of the first electrode leads 160 near to the first conductive layer 120. The first connecting portions 161 have greater width than other portions of the first electrode lead 160 with thus larger contacting area, so that it is easier for the first electrode leads 160 to electrically connect to conductive wires of the first conductive layer 120.

In the present embodiment, the first electrode leads 160 and the first conductive layer 120 are both formed in the first groove 111 of the first matrix layer 115. In other embodiments, the first electrode leads 160 can be formed on the surface of the first matrix layer 115 by screen printing or ink-jet printing, after forming the first conductive layer 120.

The second electrode leads 170 is embedded in the second baseplate 130 and electrically connected to the second conductive layer 140. When the touchscreen sensing module 100 is used to manufacture a touchscreen of an electronic device, the second electrode leads 170 are used to electrically connect the second conductive layer 140 and the controller of the electronic device, thus enabling the controller to sense operation of the touchscreen. In the present embodiment, the second electrode leads 170 are single solid lines. Grooves for receiving the second electrode lead 170 are defined in the second baseplate 130. The second electrode leads 170 are received in the grooves. Furthermore, a second connecting portion 171 is formed on each of the second electrode lead 170. The second connecting portions 171 are located on ends of the second electrode leads 170 near to the second conductive layer 140. The second connecting portions 171 have greater width than other portions of the second electrode lead 170 with thus larger contacting area, so that it is easier for the second electrode leads 170 to electrically connect to conductive wires of the second conductive layer 140.

In the present embodiment, the second electrode leads 170 and the second conductive layer 140 are both formed in the second groove 131 of the second matrix layer 135. In other embodiments, the second electrode leads 170 can be formed on the surface of the second matrix layer 135 by screen printing or ink-jet printing, after forming the second conductive layer 140.

Figure 8:
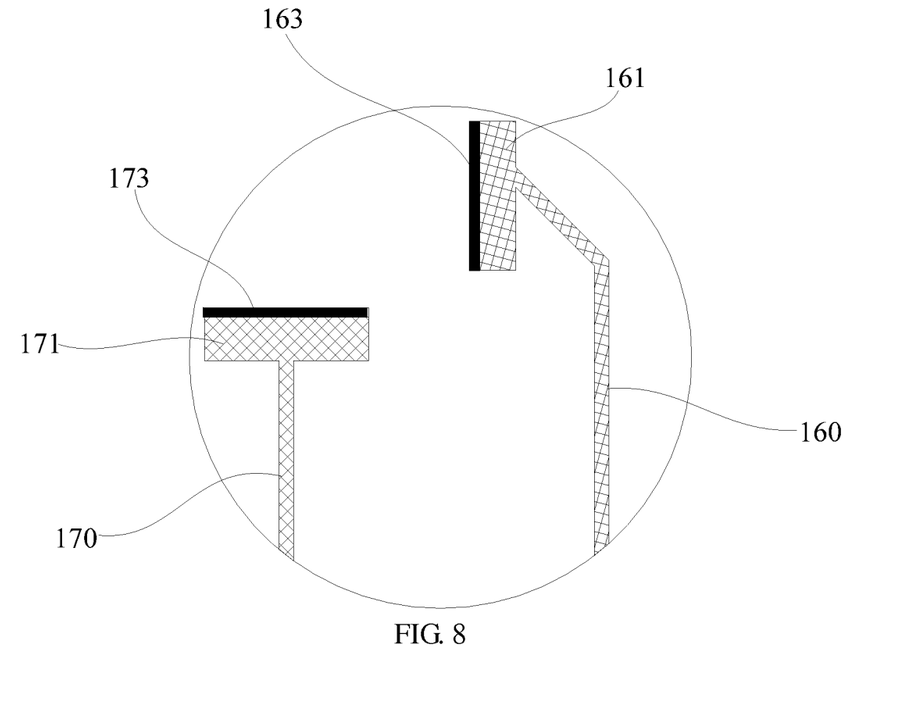
FIG. 8 is a partially-enlarged schematic view of first electrode leads and a second electrode leads of a touchscreen sensing module according to another embodiment of the present disclosure.

Referring to FIG. 8 together, in another embodiment, the first electrode leads 160 and the second electrode leads 170 are constructed by mesh-intersecting conductive wires. The first electrode leads 160 and the second electrode leads 170 respectively have consecutive first electrode switching lines 163 and consecutive second electrode switching lines 173, which are both consecutive metal wires.

The grid cycle of the first electrode leads 160 and the second electrode leads 170 is different from the gird cycle of the first conductive layer 120 and the second conductive layer 140, wherein the grid cycle means the size of the grid unit. The grid cycle of the first electrode leads 160 and the second electrode leads 170 is less than the grid cycle of the first conductive layer 120 and the second conductive layer 140. Therefore, it may be difficult to align when electrically connecting the first electrode leads 160 and the second electrode leads 170 to the first conductive layer 120 and the second conductive layer 140. The first connecting portions 161 and the second connecting portions 171 are connected to the first conductive layer 120 and the second conductive layer 140 respectively via the first electrode switching lines 163 and the second electrode switching lines 173. The first electrode switching lines 163 and the second electrode switching lines 173 are consecutive metal wires, so that, the first electrode switching lines 163 can connect to ends of at least two conductive wires of the first conductive layer 120 and the first electrode leads 160, and the second electrode switching lines 173 can connect to ends of at least two conductive wires of the second conductive layer 140 and the second electrode leads 170. Therefore, the first electrode switching lines 163 and the second electrode switching lines 173 can resolve the difficulty in aligning conductive wires of the grid units in different grid cycles, thus making it easier for the first electrode leads 160 and the second electrode leads 170 to electrically connect to the first conductive layer and the second conductive layer 140.

In order to highlight the first electrode switching lines 163 and the second electrode switching lines 173 in the figure, the first electrode switching lines 163 and the second electrode switching lines 173 are shown with a larger width than the metal conductive wires of the first electrode leads 160 and the second electrode leads 170. It should not be understood as that, the first electrode switching lines 163 and the second electrode switching lines 173 are of a greater thickness than the metal conductive wires constructed the first electrode leads 160 and the second electrode leads 170. The thickness of the first electrode switching lines 163 and the second electrode switching lines 173 can be determined according to application environment in practical application What should be pointed out is, the first electrode leads 160 and the second electrode leads 170 can be omitted in other embodiments. When manufacturing touchscreen, external leads can be adopted to extract the first conductive layer and the second conductive layer 140.

In the present embodiment, the first conductive layer 120 can be divided into a plurality of mutually-insulated first gird strips 123, and the second conductive layer 140 can be divided into a plurality of mutually-insulated second gird strips 143. The first electrode leads 160 include a plurality of leads electrically connected to the first gird strips 123 respectively. The second electrode leads 170 include a plurality of leads electrically connected to the second grid strips 143 respectively. Specifically, the conductive wires of the first conductive layer 120 are cut off in a particular direction, forming a plurality of parallel first grid strips 123. The first grid strips 123 may be used as driving grid strip in practical application. The conductive wires of the second conductive layer 140 are cut off in a particular direction, forming a plurality of parallel second grid strips 143. The second grid strips 143 may be used as sensing grid strip in practical application.

In the present embodiment, a tackifying layer (not shown) is installed respectively between the first substrate 113 and the first matrix layer 115, between the first matrix layer 115 and the second substrate 133, between the second substrate 133 and the second matrix layer 135, and between the second matrix layer 135 and the supporting substrate 150.

The tackifying layer is formed by adhesive, so the tackifying layer plays the role of increasing adhesive strength between layers. Specifically in the present embodiment, the adhesive for forming the tackifying layer can be one of epoxy resin, epoxy silane, and polyimide resin.

In the present embodiment, a hardening layer 180 is installed respectively on the side of the first baseplate 110 away from the first conductive layer 120 and the side of the supporting substrate 150 away from the second conductive layer 140. The hardening layer 180 is applicable to flexible touchscreen sensing module, and easy for full lamination.

Comparing to the traditional film, the touchscreen sensing module 100 is superior in at least the following aspects.

Firstly, the first conductive layer 120 and the second conductive layer 140 of the touchscreen sensing module 100 are respectively received in the first groove 111 and the second groove 131, and the first conductive layer 120 and the second conductive layer 140 respectively match with the first groove 111 and the second groove 131 in shape. Therefore, no etching is needed to obtain electrodes when forming conductive layers, which avoids material waste and reduces costs.

Secondly, no etching is needed during manufacturing of the touchscreen sensing module. Therefore, it avoids use of chemical substances, and thereby avoids environmental pollution.

Figure 9:
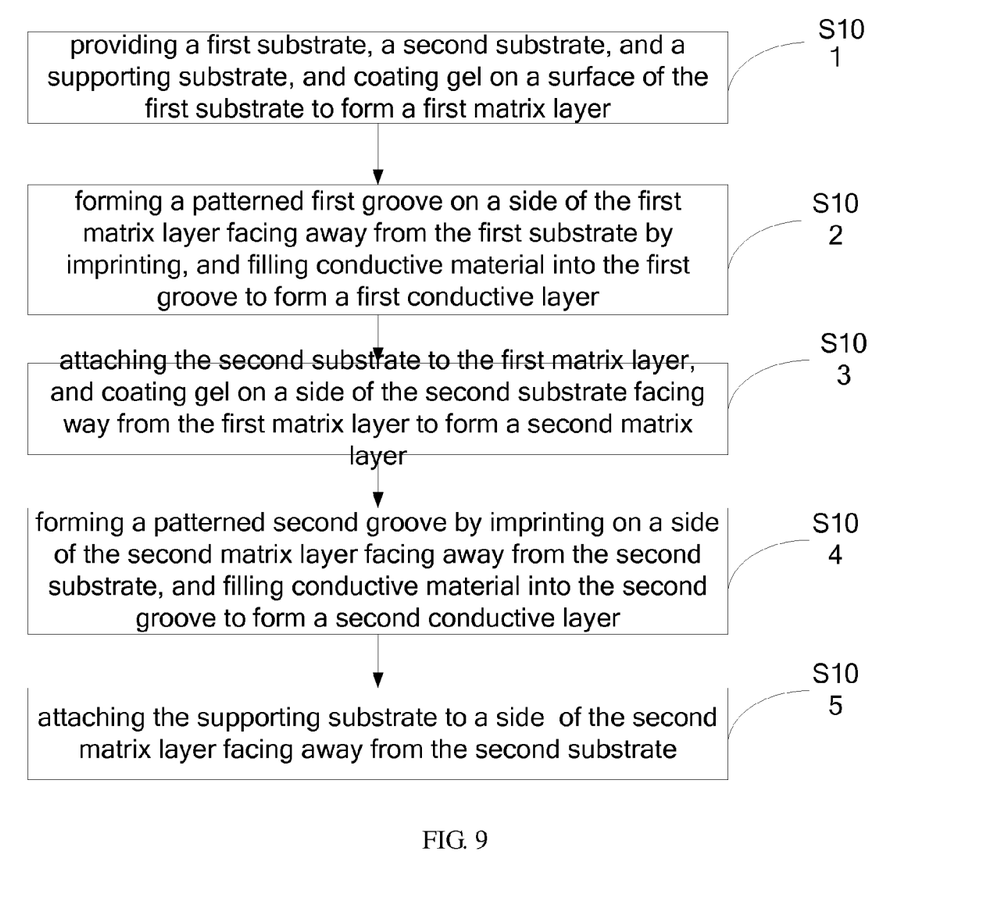
FIG. 9 is a block flow chart of an embodiment of a method for manufacturing a touchscreen sensing module.

Referring to FIG. 9, a method for manufacturing a touchscreen sensing module according to an embodiment includes steps S101-S105.

In step S101, a first substrate, a second substrate and a supporting substrate are provided. Gel is coated on a surface of the first substrate to form a first matrix layer.

In the present embodiment, the material of the first substrate 113 is polyethylene terephthalate (PET). What should be pointed out is, in other embodiments, the first and the second substrates may be of other material, such as polybutylene terephthalate (PBT), polymethylmethacrylate (PMMA), polycarbonate (PC), glass, etc. Further, the thickness of the first and the second substrates is 125 micrometers. The material of the supporting substrate is the same as the material of the first and the second substrates. It is unnecessary to go into details here.

The gel may be solvent-free UV-curing acrylic resin.

In step S102, a patterned first groove is formed by imprinting on a side facing away from the first substrate of the first matrix layer, and conductive material is filled into the first groove to form a first conductive layer.

Specifically in the present embodiment, the depth of the first groove is 3 micrometers, and the width is 2.2 micrometers. The first groove is in a grid shape. The conductive material forms intertwined conductive wires in the first groove, constructing a conductive grid. Specifically, nano silver ink is filled in the first groove by scrapping technology, and is then sintered in the condition of 150° C. to make elemental silver of the nano silver ink be sintered into conductive wires. Therefore, the patterned first conductive layer is obtained by the grid-shaped first groove, and thereby no etching of conductive layer is needed, saving material and protecting environment.

In the present embodiment, first electrode leads connecting to the first conductive layer are formed when filling conductive material into the first groove to form the first conductive layer.

In step S103, the second substrate is attached to the first matrix layer, and gel is coated on a side of the second substrate facing way from the first matrix layer, to form a second matrix layer.

In step S104, a patterned second groove is formed by imprinting on a side of the second matrix layer facing away from the second substrate, and conductive material is filled into the second groove to form a second conductive layer.

Specifically, the process of forming the second conductive layer is the same as the process of forming the first conductive layer. It is unnecessary to go into details here. In the present embodiment, second electrode leads connecting to the second conductive layer are formed when filling conductive material into the second groove to form the second conductive layer.

In step S105, the supporting substrate is attached to a side of the second matrix layer facing away from the second substrate.

In the above-mentioned method for manufacturing touchscreen sensing module, patterned grooves are formed on the first matrix layer and the second matrix layer by imprinting. The conductive material is then filled in the grooves. The conductive material is liquid, and flows along paths of the grooves to fulfill the entire grooves. Therefore, the patterned conductive layers are formed along with solidification of the conductive material. The patterned conductive layers are obtained by imprinting, so the above-mentioned method for manufacturing touchscreen sensing module avoids etching, thus saving material and protecting environment.

Although the present invention has been specifically and detailed described with reference to the above-mentioned embodiments thereof, it should not be understood as limitation of the scope of the present invention. What should be pointed out is, it is apparent to those skilled in the art that a variety of modifications and changes may be made without departing from the spirit of the present invention. Therefore, the scope of the present invention is intended to be defined by the appended claims.

What is claimed is:

1. A touchscreen sensing module, comprising:
   a first baseplate defining a first groove in a predetermined shape on a side thereof;
   a first conductive layer matching with the first groove in shape, the first conductive layer being received in the first groove;
   a second baseplate attached to a side of the first baseplate defining the first groove, a second groove in a predetermined shape being defined on a side away from the first baseplate;
   a second conductive layer matching with the second groove in shape, the second conductive layer being received in the second groove; and
   a supporting substrate attached to a side of the second baseplate defining the second groove, the first conductive layer and the second conductive layer being clamped between the supporting substrate and the first baseplate; and
   first electrode leads and second electrode leads, the first electrode leads being embedded in the first baseplate and electrically connected to the first conductive layer, the second electrode leads being embedded in the second baseplate and electrically connected to the second conductive layer;
   wherein the first electrode leads and the second electrode leads are both single solid lines, and wherein a first connecting portion in a strip shape is provided on the end of a first electrode lead near to the first conductive layer, the first connecting portion has a greater width than other portion of the first electrode lead, a second connecting portion in a strip shape is provided on the end of a second electrode lead near to the second conductive layer, and the second connecting portion has a greater width than other portion of the second electrode lead.

2. The touchscreen sensing module of claim 1, wherein the first baseplate comprises a first substrate and a first matrix layer attached to the first substrate, the first groove is defined on the first matrix layer, the second baseplate comprises a second substrate and a second matrix layer attached to the second substrate, the second groove is defined on the second matrix layer.

3. The touchscreen sensing module of claim 2, wherein a thickness of the first conductive layer is not greater than a depth of the first groove, and a thickness of the second conductive layer is not greater than a depth of the second groove.

4. The touchscreen sensing module of claim 1, wherein the first conductive layer and the second conductive layer are both conductive grids constructed by intercrossed conductive wires, the conductive grids comprise a plurality of grid units, the conductive wires of the first conductive layer are received in the first groove, the conductive wires of the second conductive layer are received in the second groove, and a width of the conductive wires ranges from 500 nm to 5 μm.

5. The touchscreen sensing module of claim 4, wherein material of the conductive wires is selected from the group consisting of metal, conductive polymer, grapheme, carbon nano-tube, and ITO.

6. The touchscreen sensing module of claim 5, wherein the metal comprises one selected from the group consisting of Au, Ag, Cu, Al, Ni, Zn, and alloy of at least two thereof.

7. The touchscreen sensing module of claim 4, wherein the grid units are rhomboid, or rectangle, or parallelogram, or curved quadrilateral, and a projection of the center of a grid unit of the second conductive layer on the first conductive layer is spaced a predetermined distance from the center of a grid unit of the first conductive layer.

8. The touchscreen sensing module of claim 7, wherein the projection of the center of the grid unit of the second conductive layer on the first conductive layer is spaced a distance between 1/3a and $\sqrt{2}a/2$ from the center of the grid unit of the first conductive layer, where "a" is the side length of the grid unit.

9. The touchscreen sensing module of claim 7, wherein a projection on the first conductive layer of connecting lines of centers of the grid units in the same arrangement direction on the second conductive layer are misaligned with connecting lines of centers of the grid units in the same arrangement direction on the first conductive layer.

10. The touchscreen sensing module of claim 1, wherein the first conductive layer is divided into a plurality of mutually-insulated first grid strips, the second conductive layer is divided into a plurality of mutually-insulated second grid strips, the first electrode leads comprise a plurality of leads electrically connected to the first grid strips respectively, and the second electrode leads comprise a plurality of leads electrically connected to the second grid strips respectively.

11. A touchscreen sensing module, comprising:
a first baseplate defining a first groove in a predetermined shape on a side thereof;
a first conductive layer matching with the first groove in shape, the first conductive layer being received in the first groove;
a second baseplate attached to a side of the first baseplate defining the first groove, a second groove in a predetermined shape being defined on a side away from the first baseplate;
a second conductive layer matching with the second groove in shape, the second conductive layer being received in the second groove; and
a supporting substrate attached to a side of the second baseplate defining the second groove, the first conductive layer and the second conductive layer being clamped between the supporting substrate and the first baseplate; and
first electrode leads and second electrode leads, the first electrode leads being embedded in the first baseplate and electrically connected to the first conductive layer, the second electrode leads being embedded in the second baseplate and electrically connected to the second conductive layer;
wherein the first electrode leads and the second electrode leads are constructed by mesh-intersecting conductive wires, and a grid cycle of the first electrode leads and the second electrode leads is less than a grid cycle of the first conductive layer and the second conductive layer.

12. The touchscreen sensing module of claim 11, wherein a first electrode switching line is provided between a first electrode lead and a first conductive layer, a second electrode switching line is provided between the second electrode lead and the second conductive layer, the first switching line and the second switching line are consecutive conductive wires, the first switching line is connected to the first conductive layer and ends of at least two conductive wires of the first electrode lead, and the second switching line is connected to the second conductive layer and ends of at least two conductive wires of the second electrode lead.

13. A monitor, comprising:
a display; and
a touchscreen sensing module comprising:
a first baseplate defining a first groove in a predetermined shape on a side thereof;
a first conductive layer matching with the first groove in shape, the first conductive layer being received in the first groove;
a second baseplate attached to a side of the first baseplate defining the first groove, a second groove in a predetermined shape being defined on a side away from the first baseplate;
a second conductive layer matching with the second groove in shape, the second conductive layer being received in the second groove; and
a supporting substrate attached to a side of the second baseplate defining the second groove, the first conductive layer and the second conductive layer being clamped between the supporting substrate and the first baseplate; and
a side away from the first conductive layer of the first baseplate being bonding with the display to make the touchscreen sensing module be attached to the display; and
first electrode leads and second electrode leads, the first electrode leads being embedded in the first baseplate and electrically connected to the first conductive layer, the second electrode leads being embedded in the second baseplate and electrically connected to the second conductive layer;
wherein the first electrode leads and the second electrode leads are both single solid lines, and wherein a first connecting portion in a strip shape is provided on the end of a first electrode lead near to the first conductive layer, the first connecting portion has a greater width than other portion of the first electrode lead, a second connecting portion in a strip shape is provided on the end of a second electrode lead near to the second conductive layer, and the second connecting portion has a greater width than other portion of the second electrode lead.

14. A method for manufacturing a touchscreen sensing module, comprising steps of:
providing a first substrate, a second substrate, and a supporting substrate, and coating gel on a surface of the first substrate to form a first matrix layer;

forming a patterned first groove on a side of the first matrix layer facing away from the first substrate by imprinting, and filling conductive material into the first groove to form a first conductive layer;

attaching the second substrate to the first matrix layer, and coating gel on a side of the second substrate facing way from the first matrix layer to form a second matrix layer;

forming a patterned second groove by imprinting on a side of the second matrix layer facing away from the second substrate, and filling conductive material into the second groove to form a second conductive layer;

attaching the supporting substrate to a side of the second matrix layer facing away from the second substrate;

embedding first electrode leads in the first baseplate and electrically connecting the first electrode leads to the first conductive layer; and embedding second electrode leads and the second electrode leads are both single solid lines, second electrode leads to the second conductive layer;

wherein the first electrode leads and the second electrode leads are both single solid lines, and wherein a first connecting portion in a strip shape is provided on the end of a first electrode lead near to the first conductive layer, the first connecting portion has a greater width than other portion of the first electrode lead, a second connecting portion in a strip shape is provided on the end of a second electrode lead near to the second conductive layer, and the second connecting portion has a greater width than other portion of the second electrode lead.

15. The method for manufacturing monitor of claim 14, wherein first electrode leads connecting to the first conductive layer are formed when filling conductive material into the first groove to form the first conductive layer, and second electrode leads connecting to the second conductive layer are formed when filling conductive material into the second groove to form the second conductive layer.

* * * * *